United States Patent
Wang

(10) Patent No.: US 7,405,125 B2
(45) Date of Patent: Jul. 29, 2008

(54) TUNNEL OXYNITRIDE IN FLASH MEMORIES

(75) Inventor: Szu-Yu Wang, Shiaugang Chiu (TW)

(73) Assignee: Macronix International Co., Ltd., Hsinchu (TW)

( * ) Notice: Subject to any disclaimer, the term of this patent is extended or adjusted under 35 U.S.C. 154(b) by 393 days.

(21) Appl. No.: 10/858,040

(22) Filed: Jun. 1, 2004

(65) Prior Publication Data

US 2005/0266637 A1    Dec. 1, 2005

(51) Int. Cl.
  *H01L 21/336*  (2006.01)
  *H01L 21/31*   (2006.01)
(52) U.S. Cl. ............... 438/264; 438/775; 257/E21.267
(58) Field of Classification Search ............. 438/264, 438/775; 257/E21.267
  See application file for complete search history.

(56) References Cited

U.S. PATENT DOCUMENTS

| | | | |
|---|---|---|---|
| 5,885,870 A | 3/1999 | Maiti et al. | |
| 6,228,779 B1 | 5/2001 | Bloom et al. | |
| 6,380,033 B1 | 4/2002 | He et al. | |
| 6,413,881 B1 | 7/2002 | Aronowitz et al. | |
| 6,417,570 B1 | 7/2002 | Ma et al. | |
| 6,503,846 B1 * | 1/2003 | Niimi et al. | 438/776 |
| 6,559,007 B1 | 5/2003 | Weimer | |
| 2002/0072177 A1 * | 6/2002 | Grider | 438/287 |
| 2005/0042869 A1 * | 2/2005 | Ohmi et al. | 438/689 |

OTHER PUBLICATIONS

Huff, H.R. et al., Ad Hoc Meeting on High-K Gate Dielectrics at the Semiconductor Interface Specialists Conference (SISC) Nov. 30, 2001, 3 pages.
Al-Shareef, H.N., et al., "Device performance of in situ steam generated gate dielectric nitrided by remote plasma nitridation," Applied Physics Letters 78(24) Jun. 11, 2001, 3875-3877.
Silvestri, H.H., et al., "Reduction of Microdefects Responsible for Degradation of Thin Gate Oxides," Final Report 1998-1999 for Micro Project 98-056, 4 pages.
Maiti, Bikas, et al., "Reoxidized Nitric Oxide (ReoxNO) Process and its Effect on the Dielectric Reliability of the LOCOS Edge," 1995 Symposium on VLSI Technology Digest of Papers, 63-64.

* cited by examiner

*Primary Examiner*—Lex Malsawma
(74) *Attorney, Agent, or Firm*—Kenta Suzue; Haynes Beffel & Wolfeld LLP

(57) ABSTRACT

Methods for forming a tunnel oxide structure device and methods for forming the structure are described. A structure comprising nitrogen is formed on a semiconductor substrate. The structure is oxidized. Nitrogen of the oxide structure is redistributed to form a region of concentrated nitrogen. Oxidizing the structure and redistributing the nitrogen is performed via radical oxidation. Nitrogen is added to the oxide structure. The region of concentrated nitrogen helps to regulate the depth of the added nitrogen.

41 Claims, 5 Drawing Sheets

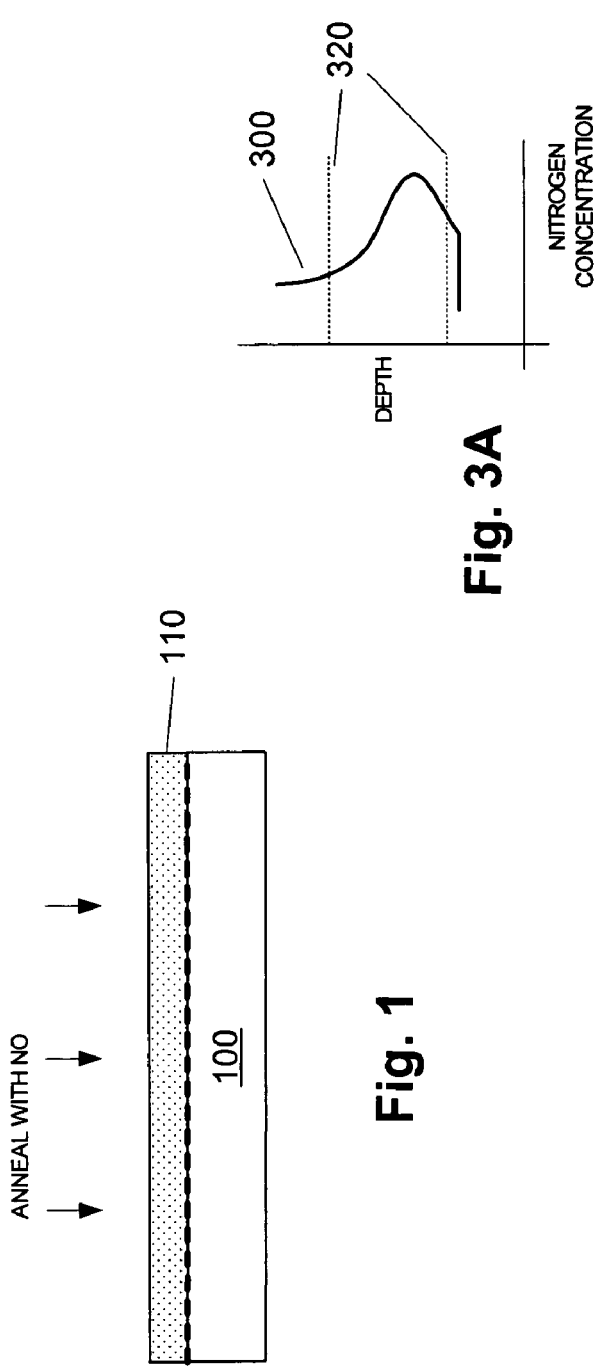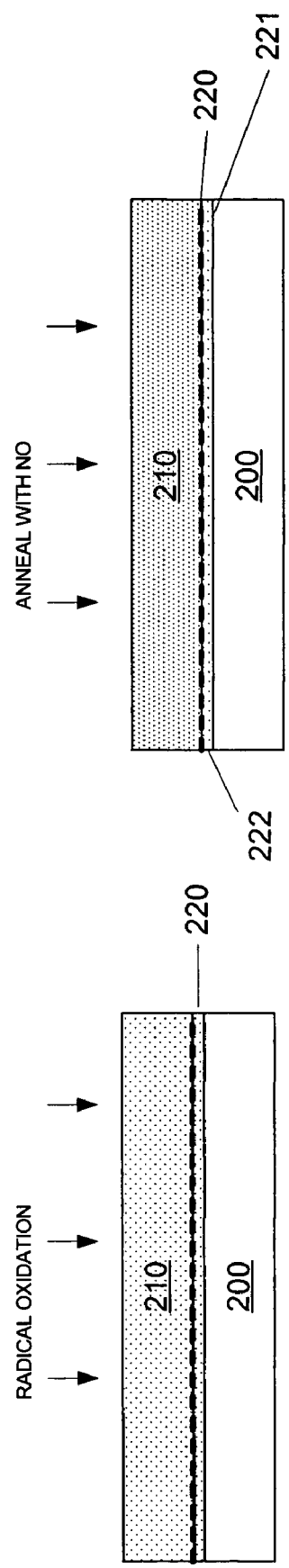

TUNNEL OXYNITRIDE IN FLASH MEMORIES

BACKGROUND OF THE INVENTION

1. Field of the Invention

The present invention relates to a semiconductor process. More particularly, the present invention relates to a method for forming a tunnel oxynitride structure of non-volatile memory.

2. Description of Related Art

Non-volatile memory devices rely on a tunnel oxide structure, which should be sufficiently thin so that carriers can tunnel through the tunnel oxide under a sufficiently high electric field. The quality and stability of the tunnel oxide structure are important issues, since the charge retention capability and other important characteristics of non-volatile memory devices are closely related to these properties.

Many methods provide for improving the quality and stability of a tunnel oxide, which often utilize nitrogen doping of silicon oxide. For example, U.S. Pat. Nos. 5,885,870 and 6,380,033 disclose a method for forming a tunnel oxide structure, where NO or N2O-annealing is performed to add nitrogen to the tunnel oxide structure. The added nitrogen yields benefits such as reducing both the leakage current induced by Fowler-Nordheim stress induced leakage current (FN-SILC) and the threshold voltage (Vg) shift of a non-volatile memory device. However, with such methods, the nitrogen atoms tend to pile up at the bottom interface of the tunnel oxide structure, so that the carrier mobility and the integrity of the periphery gate oxide of the non-volatile memory device are degraded.

Accordingly, it is desirable to manufacture a non-volatile memory device with nitrogen added to the tunneling oxide without piling up all the nitrogen at the oxide interface.

SUMMARY OF THE INVENTION

Accordingly, this invention provides methods for manufacturing a semiconductor with a nitrogen rich gate oxide and a semiconductor device having an improved gate oxide. In one aspect, a method comprises forming a structure comprising nitrogen on a surface of a semiconductor substrate, oxidizing the structure to provide a nitrogen containing oxide structure, redistributing nitrogen of the oxide structure to form a region of concentrated nitrogen in the oxide structure spaced away from the interface between the oxide structure and the semiconductor substrate, and after forming the region of concentrated nitrogen, adding nitrogen to at least a portion of the oxide structure at a range of depths shallower than the region of concentrated nitrogen. In various embodiments, redistributing nitrogen moves nitrogen away from the surface of the substrate. In various embodiments, forming the structure comprising nitrogen includes thermally annealing the surface of the semiconductor substrate, for example in the presence of nitrous oxide, nitric oxide, ammonia and/or ND3. ND3 is ammonia with the hydrogen replaced by deuterium. In some embodiments, forming the structure comprising nitrogen includes depositing the structure via plasma nitridation and/or deposition such as via CVD. The region of concentrated nitrogen resists movement of added nitrogen to depths deeper than the region of concentrated nitrogen, thereby protecting the interface between the oxide structure and the semiconductor substrate from the added nitrogen. In various embodiments, adding nitrogen includes thermally annealing the oxide structure, for example in the presence of nitrous oxide, nitric oxide, ND3, and/or ammonia. In various embodiments, oxidizing the structure and redistributing the nitrogen of the oxide structure are performed by radical oxidation processes, such as in situ steam generation, and/or low pressure radical oxidation. Radical oxidation occurs in the presence of oxygen radicals and/or hydroxyl radicals.

In another aspect, the method comprises forming a structure comprising nitrogen on a surface of a semiconductor substrate, performing radical oxidization of the structure to provide a nitrogen containing oxide structure, and adding nitrogen to at least a portion of the oxide structure. In various embodiments, forming the structure comprising nitrogen includes thermally annealing the surface of the semiconductor substrate, for example in the presence of nitrous oxide, nitric oxide, ammonia, and/or ND3. In some embodiments, forming the structure comprising nitrogen includes depositing the structure via plasma nitridation and/or deposition such as via CVD. In various embodiments, adding nitrogen includes thermally annealing the oxide structure, for example in the presence of nitrous oxide, nitric oxide, and/or ammonia. In various embodiments, performing radical oxidization includes oxidizing the structure and redistributing the nitrogen of the structure to form a region of concentrated nitrogen in the structure, and/or move nitrogen deeper into the structure. The region of concentrated nitrogen resists movement of added nitrogen to depths deeper than the region of concentrated nitrogen. Performing radical oxidization includes in situ steam generation and/or low pressure radical oxidation. Radical oxidation occurs in the presence of oxygen radicals and/or hydroxyl radicals.

In another aspect, a semiconductor device includes a semiconductor substrate and an oxide structure on the semiconductor substrate. Relative to a peak of nitrogen concentration occurring in the oxide structure at a distance from the interface between the oxide structure and the substrate, an interface layer in the oxide structure between the semiconductor substrate and the peak has a lower concentration of nitrogen. The lower concentration of nitrogen avoids decreased mobility of charge in the substrate. At the same time, the concentration of nitrogen (such as in the form of silicon nitride) in the oxide structure remains sufficient to reduce stress induced leakage current. The oxide structure in some embodiments acts as a gate dielectric for a non-volatile memory device, adapted for programming and erasing by tunneling through the gate dielectric.

In another aspect, a method for forming a nitrogen rich tunnel oxide comprises forming a silicon oxynitride structure as the tunnel oxide structure on a semiconductor substrate, performing an oxidation process to cause nitrogen atom redistribution in the silicon oxynitride structure, performing a thermal annealing process in the presence of a source of nitrogen to add nitrogen atoms into the silicon oxynitride structure. Forming the silicon oxynitride structure includes thermal annealing. Performing the oxidation process includes an in-situ steam generation (ISSG) process, for example between 900° C. to 1100° C. for 10 to 200 seconds. The thermal annealing process includes furnace annealing and/or rapid thermal annealing. In some embodiments, thermal annealing is conducted between 900° C. to 1100° C. for 10 to 300 seconds for rapid thermal annealing, and between 850° C. to 1100° C. for 5 to 120 minutes for furnace annealing. Other aspects and advantages of the present invention can be seen on review of the drawings, the detailed description, and the claims, which follow.

BRIEF DESCRIPTION OF THE DRAWINGS

FIGS. 1, 2, and 3 illustrate the substrate in different steps of the process flow of forming a tunnel oxide structure.

FIG. 3A is a graph of the concentration of nitrogen versus depth in the oxide structure.

DESCRIPTION OF THE PREFERRED EMBODIMENTS

Figure 4:
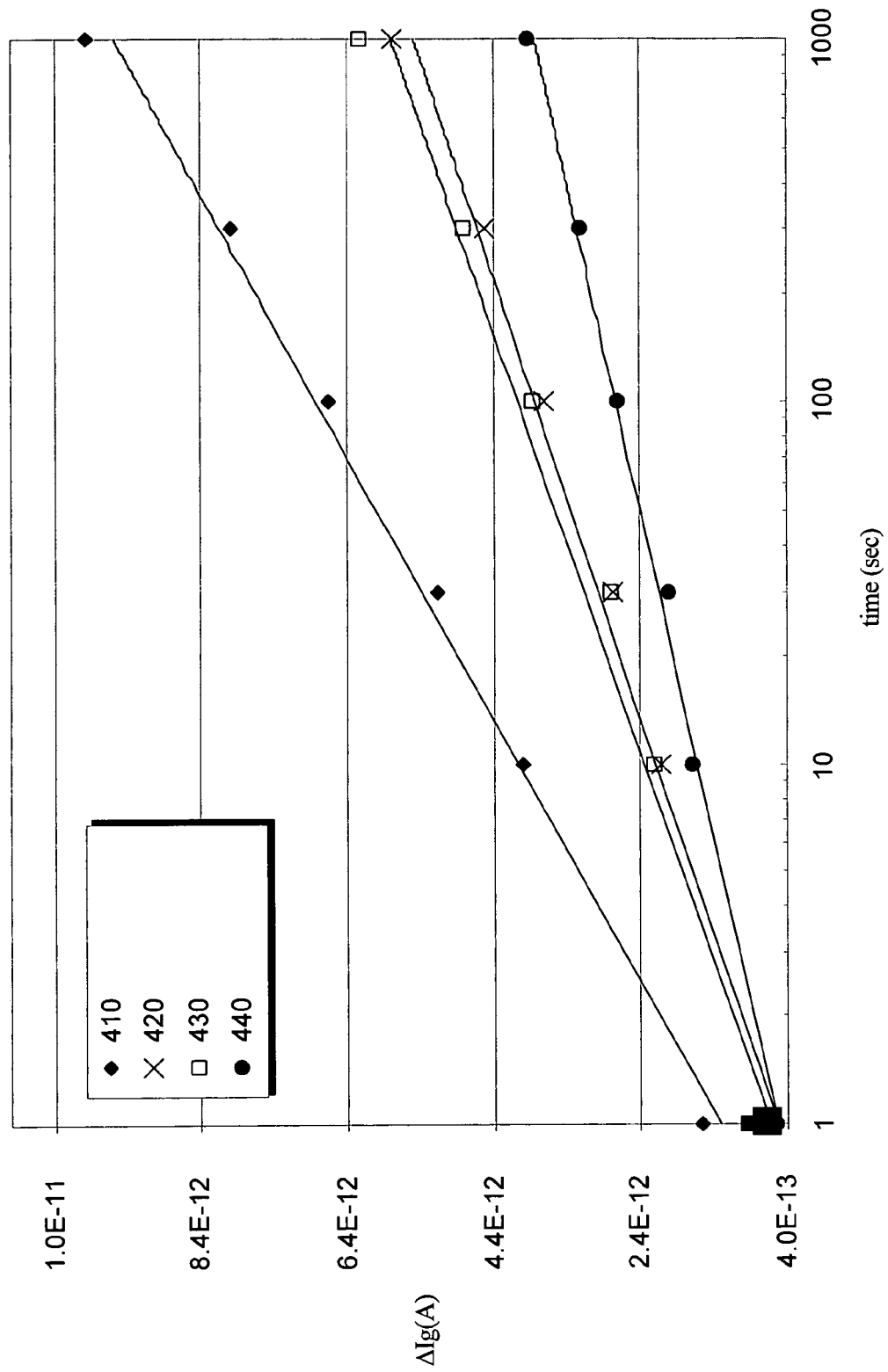
FIG. 4 shows a graph of the leakage current induced by Fowler-Nordheim stress over time.

A detailed description of embodiments is provided with reference to FIGS. 1-8. FIGS. 1 and 2 illustrate the substrate in different steps of the process flow of forming a tunnel oxide structure.

Referring to FIG. 1, a silicon substrate 100, such as a P-doped single-crystal silicon substrate, is provided. An oxide structure 110 to be used for example as a tunnel oxide structure is formed on the silicon substrate 100 by, for example, thermally annealing the substrate in the presence of a source of nitrogen, like nitric oxide (NO). In some embodiments, the oxide structure 110 includes silicon oxynitride, a combination of silicon oxide and silicon nitride. Inert gases such as N2 or Ar may be added to modify the concentration of the source gas. The oxide structure 110 can also be formed by thermally annealing the substrate 100 in the presence of nitrous oxide (N2O), ammonia or ND3.

In other embodiments, a structure with nitrogen is made on the semiconductor substrate by depositing the structure on the semiconductor substrate, such as via chemical vapor deposition or plasma nitridation. The structure can be silicon oxynitride (SiOxNy), a nitride such as Si3N4, or any other material with nitrogen atoms that can be redistributed in later processing.

FIG. 2 illustrates redistribution of nitrogen in an oxide structure 210, like the oxide structure 110 of FIG. 1, by a radical oxidation process such as in-situ steam generation (ISSG) oxidation process. Radical oxidation of the oxide structure 210 redistributes nitrogen in the oxide structure 210. A region of concentrated nitrogen atoms forms near the bottom of the oxide structure 210, spaced away from the interface between the oxide structure 210 and the silicon substrate 200. The peak 220 represents the position of a peak in the nitrogen concentration in the region of concentrated nitrogen atoms in the oxide structure 210. The in-situ steam generation (ISSG) oxidation process is performed at a temperature of 900° C. to 1100° C. for 10 to 200 seconds.

FIG. 3 illustrates a second thermal annealing process performed in the presence of a source of nitrogen atoms to diffuse added nitrogen atoms into the oxide structure 210. One source of nitrogen atoms suitable for this process includes nitric oxide (NO). Thermally annealing in the presence of nitrous oxide (N2O) or ammonia are other alternatives for adding nitrogen to the oxide structure 210. The second annealing process is a furnace or rapid thermal annealing (RTA) process, and is preferably conducted at between 850° C. to 1100° C. for 10 seconds to 2 hours.

At the conclusion of the second thermal annealing process, an embodiment of the invention is formed. The oxide structure 210 is separated from substrate 200 by an interface 221. The oxide structure 210 is rich in nitrogen, at concentrations sufficient to reduce stress induced leakage current in the oxide structure. The oxide structure 210 includes an interface layer 222 between the interface 221 and the peak of the nitrogen concentration 220. Despite the nitrogen rich content of the oxide structure 210, the nitrogen concentration at the interface layer 222 is sufficiently low to avoid decreased mobility of charge in the substrate 200. The relatively low nitrogen concentration in the interface layer 222 results from the position of the peak 220 of the region of concentrated nitrogen being spaced away from the interface 221. The nitrogen peak 220 resists the movement of added nitrogen to depths deeper than the region of concentrated nitrogen, protecting the interface layer 222 from the added nitrogen by preventing a pileup of nitrogen at the interface 221 which would otherwise degrade carrier mobility in the substrate 200. The oxide structure 210 has a thickness anywhere between below about 30 Angstroms and above about 120 Angstroms.

FIG. 3A is a graph of the concentration of nitrogen versus depth in the oxide structure of FIG. 3. The graph is heuristic and not empirical. The peak of the curve 300 coincides with the position of peak 220 in FIG. 3. Below the peak of the curve, a sharp drop in the nitrogen concentration occurs at the interface 221 shown in FIG. 3 between the oxide 210 and the substrate 200. The interface layer 222 is between the peak of the curve and the sharp drop in the curve. Above the peak of the curve, the nitrogen concentration decreases and is interrupted by the top surface of the oxide. It is believed that a portion of the nitrogen concentration between the top surface of the oxide and the oxide/substrate interface has a substantially Gaussian distribution. Lines 320 bracket a portion of the nitrogen concentration near the peak which has a substantially Gaussian distribution.

Figure 5:
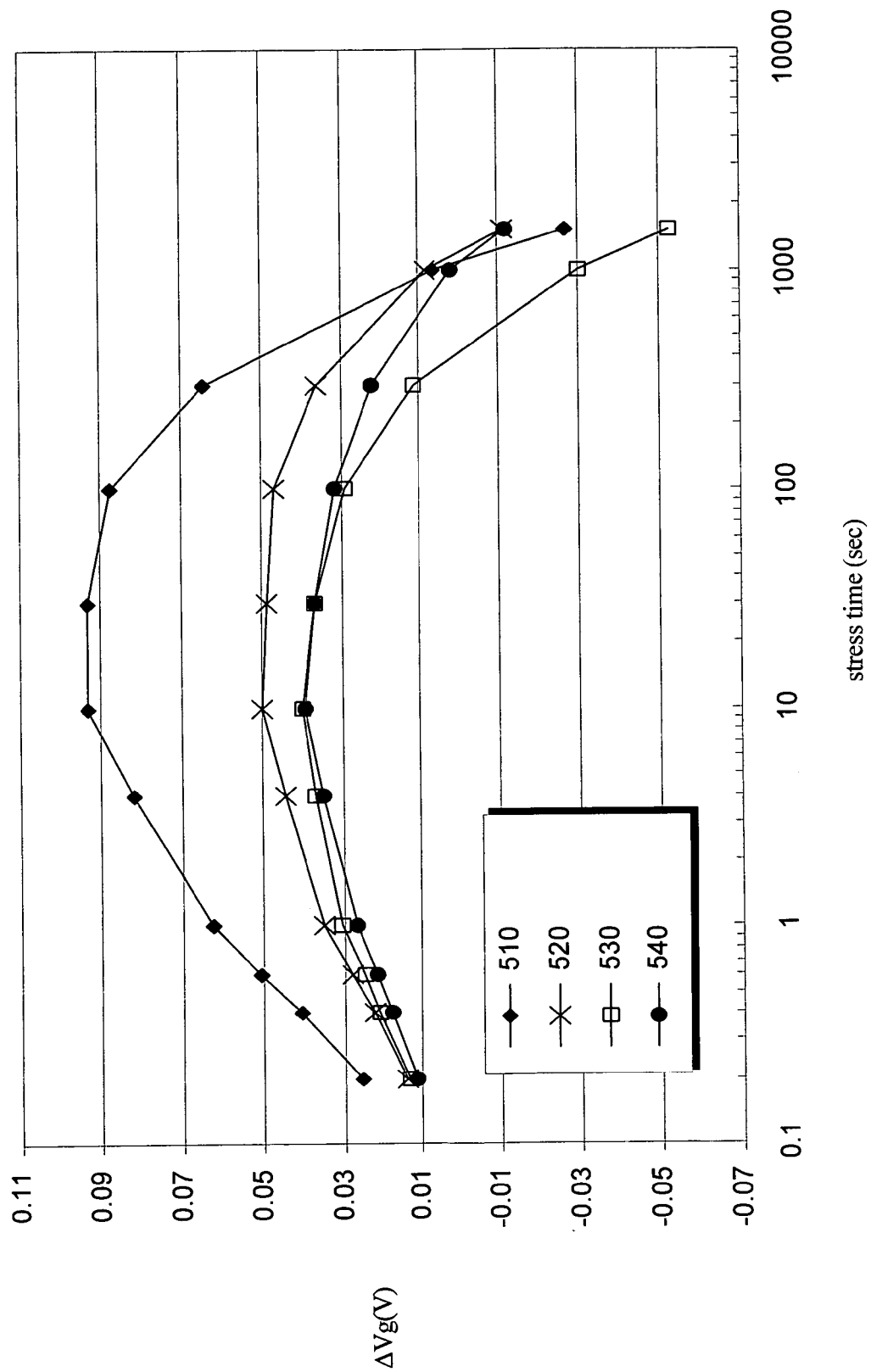
FIG. 5 shows a graph of a Vg-shift over time.

The quality and characteristics of each kind of tunnel oxynitride structure are evaluated via several tests on various semiconductor samples, and the results are shown in FIGS. 4 and 5. The various semiconductor samples include: 1) a pure silicon oxide grown by ISSG having a thickness of 85 Å, 2) a pure silicon oxide grown by ISSG and annealed in a furnace in the presence of NO having a final thickness of 85 Å, 3) a pure silicon oxide grown by ISSG and annealed in the presence of NO having a final thickness of 85 Å, and 4) an embodiment of the invention where the oxide structure has a thickness of 85 Å, made by annealing Si in the presence of NO, oxidizing with an ISSG process, and annealing again in the presence of NO. Different samples are then fabricated based on the respective tunnel oxynitride structures.

Referring to FIG. 4, a graph is shown of a leakage current induced by Fowler-Nordheim stress over time. Trace 410 corresponds to the pure oxide structure having a thickness of 85 Å. Trace 420 corresponds to the oxide structure annealed in a furnace in the presence of NO having a final thickness of 85 Å. Trace 430 corresponds to the oxide annealed in an ISSG process in the presence of NO having a final thickness of 85 Å. Trace 440 corresponds to an embodiment of the invention where the oxide structure has a thickness of 85 Å, made by annealing Si in the presence of NO, oxidizing with an ISSG process, and annealing again in the presence of NO. In the test, a negative constant current Fowler-Nordheim stress of about −10 mA/cm2 (corresponding to an electric field of about −11.5 MV/cm) is applied across the tunnel oxide structure of each sample for various time periods, and then the differential stress induced leakage current (ΔSILC) of each sample is measured under a low electric field of 7 MV/cm. As shown in FIG. 4, the leakage current shown by the embodiment is greatly improved under the conditions of FN-SILC.

FIG. 5 shows the results of a Vg-shift test on the same samples. Trace 510 corresponds to the pure oxide structure having a thickness of 85 Å. Trace 520 corresponds to the oxide structure annealed in a furnace in the presence of NO having a final thickness of 85 Å. Trace 530 corresponds to the oxide structure annealed in the presence of NO having a final thickness of 85 Å. Trace 540 corresponds to an embodiment of the invention where the oxide structure has a thickness of 85 Å, made by annealing Si in the presence of NO, oxidizing with an ISSG process, and annealing again in the presence of NO. In the test, a negative constant current stress (−CCS) of about −10 mA/cm$^2$ is applied across the tunnel oxide structure of each sample, and then the Vg shift (ΔVg) of each sample measured. The traces of the Vg shift versus stress time show the extremely low level of traps that resist damage in trace 540, in contrast to the other samples.

Figure 6:
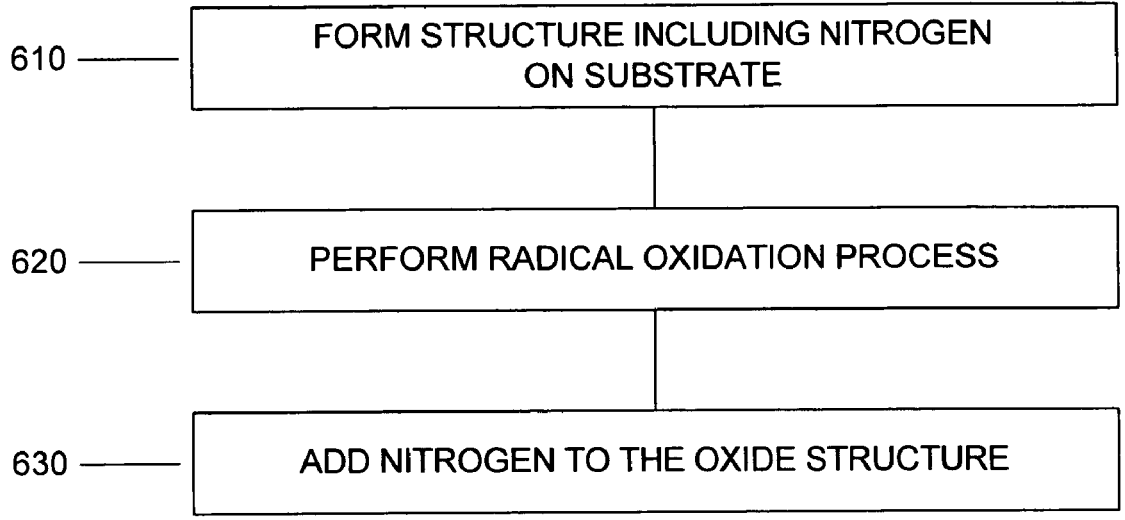
FIGS. 6 and 7 are simplified flowcharts of forming an oxide structure.
Figure 7:
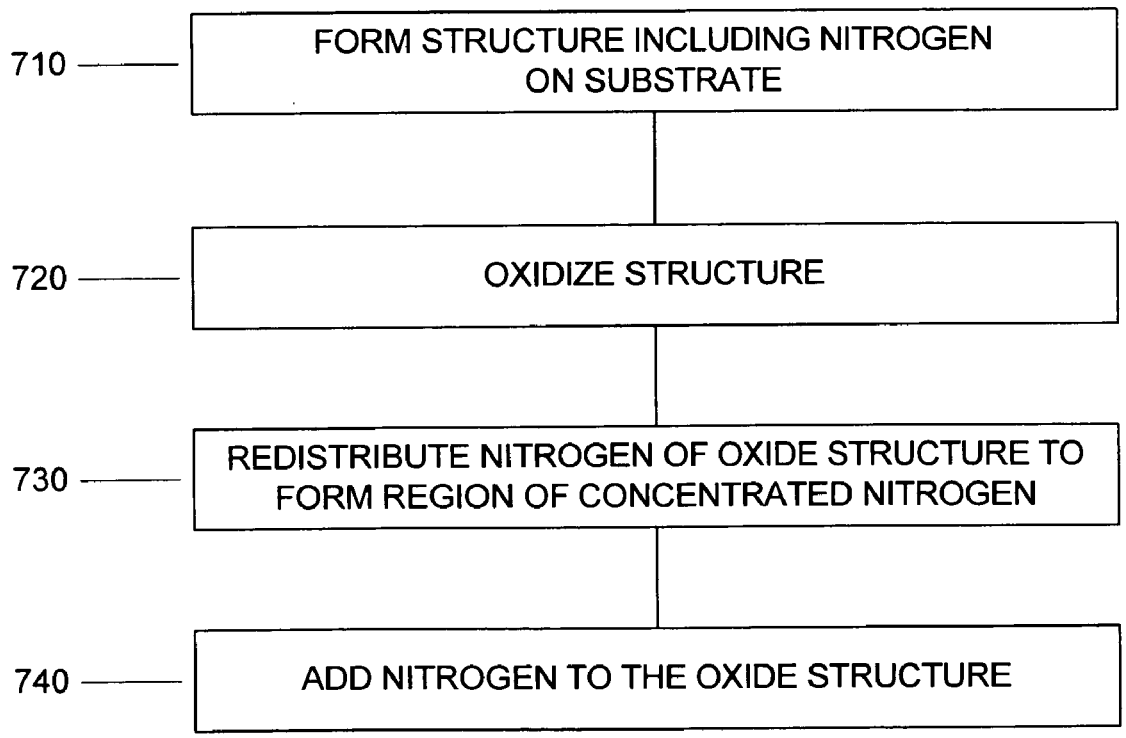

FIGS. 6 and 7 are simplified flowcharts of forming an oxide structure. Referring to FIG. 6, in 610, a structure including nitrogen is formed on the substrate, for example by deposition, annealing, or plasma nitridation. In some embodiments, the thickness ranges from 0~30 Å. The tested samples FIGS. 4 and 5 have an oxynitride thickness of about 20 Å. In 620, an oxidation process is performed, preferably radical oxidation. Radical oxidization includes in situ steam generation (ISSG) and/or low pressure radical oxidation (LPRO). The tested samples of FIGS. 4 and 5 used an ISSG process in a RTP-type ISSG chamber (made by AMAT) with reduced pressure to generate O* and OH* radicals. The temperature of the ISSG process is in a range between 900° C.~1100° C. The tested samples of FIGS. 4 and 5 had a temperature of 1050° C. The ISSG ambients are a mixture of H2 and O2, with a H2/O2 gas flow ratio in the range of 0~33%. The tested samples FIGS. 4 and 5 had a H2/O2 gas flow ratio of 33%. The pressure is 0~20 torr, and the process time is 10 to 200 sec. LPRO is performed with a low pressure furnace, such as one made by TEL. In 630, nitrogen is added to the oxide structure. Both the formation of the structure including nitrogen and the addition of nitrogen to the structure is performed with thermal annealing, for example in the presence of nitrous oxide, nitric oxide, and/or ammonia. The temperature is 850° C. to 1100° C. (1050° C. in the tested samples FIGS. 4 and 5). The ambients include N2 and the reactant gas NO. N2 acts to dilute nitrogen carrying gas, and is inert when the temperature is less than 1000° C. Gas flow rates are 0~10 slm (N2/NO=5/5 slm in the tested samples FIGS. 4 and 5). The pressure is 600~760 torr (740 torr in the tested samples FIGS. 4 and 5). The annealing time is from 10 to 300 sec if by an RTP system (180 sec for the first anneal and 30 sec for the second anneal in the tested samples FIGS. 4 and 5), or 5 to 120 min for a conventional furnace.

Referring to FIG. 7, in 710, a structure including nitrogen is formed on the substrate. In 720, the structure is oxidized. In 730, nitrogen of the oxide structure is redistributed to form a region of concentrated nitrogen. In 740, nitrogen is added to the oxide structure. In various embodiments, oxidizing the structure and redistributing the nitrogen of the oxide structure are performed by radical oxidation, in situ steam generation, and/or low pressure radical oxidation.

Figure 8:
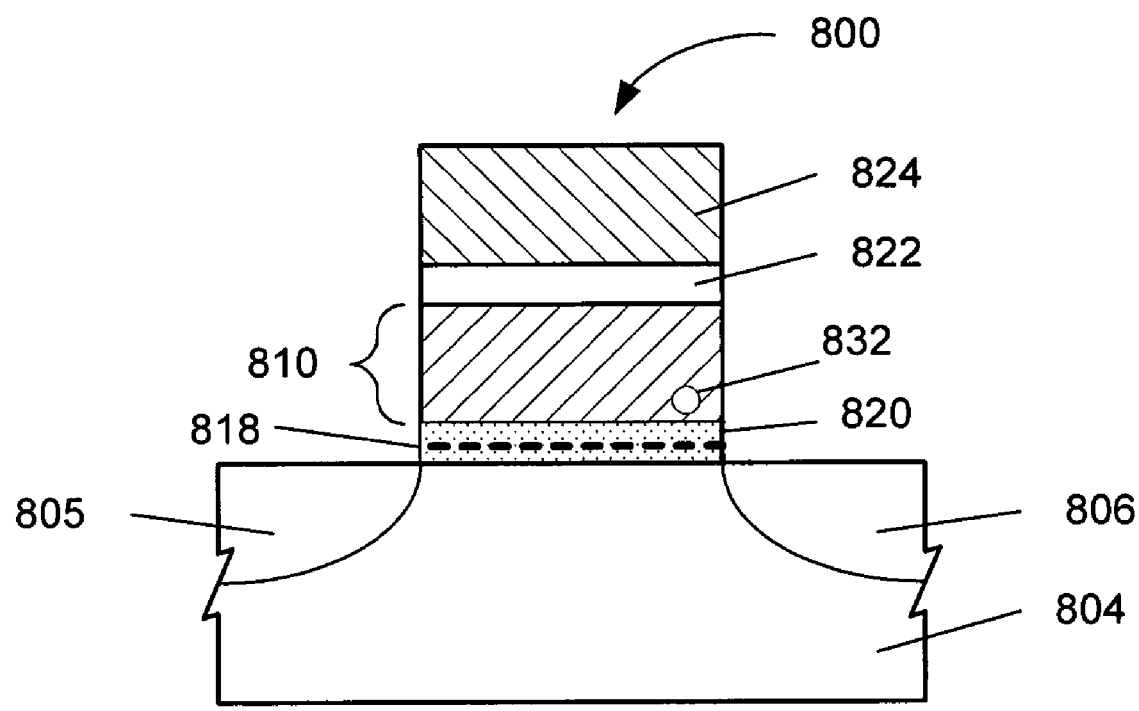
FIG. 8 illustrates a semiconductor device having a tunnel dielectric according to the present invention.

FIG. 8 is a simplified diagram of an NROM memory cell including a tunnel dielectric like that described with reference to FIG. 3. The memory cell 800 is implemented in a semiconductor substrate 804. The cell includes a source 805 and a drain 806 formed by respective diffusion regions, separated by a channel in the substrate 804. A control gate 824 overlies the channel. A charge storage element 810 is isolated by an insulator such as an oxide structure 820 like that of FIG. 3, between the charge storage element 810 and the channel. The charge storage element 810 comprises silicon nitride in an NROM cell. In other embodiments, other charge trapping material, such as Al2O3, HfOx, ZrOx, or other metal oxide can be used to form memory cells. Charge 832 is trapped in the nitride layer, for example when the cell is biased for hot electron programming. The invention can be applied to other types of memory cells, such as floating gate memory cells, ROM cells, and so on.

The oxide structure 820 has a concentration of nitrogen sufficient to reduce stress induced leakage current. The concentration of the nitrogen forms a peak 818 in the oxide structure 820 at a distance from an interface between the semiconductor substrate 804 and the oxide structure 820. The distance is believed to be approximately 12 Angstroms. It is believed that the concentration of the nitrogen at, above, and below the peak forms a Gaussian-like distribution. The concentration of nitrogen is sufficient to reduce stress induced leakage current. In one embodiment, because the peak is relatively close to the interface between the substrate and the tunnel oxide and because of the Gaussian-like distribution, the concentration of nitrogen at depths deeper than the peak is generally higher than the concentration of nitrogen at depths shallower than the peak. In another embodiment, the concentration of nitrogen at depths shallower than the peak is generally higher than the concentration of nitrogen at depths deeper than the peak. In yet another embodiment, the concentration of nitrogen at depths shallower than the peak is substantially the same as the concentration of nitrogen at depths deeper than the peak.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for manufacturing a semiconductor, comprising:
    forming a structure comprising nitrogen on a surface of a semiconductor substrate;
    oxidizing the structure to provide a nitrogen containing oxide structure;
    redistributing nitrogen of the oxide structure to form a region of concentrated nitrogen in the oxide structure; and
    after forming the region of concentrated nitrogen, adding nitrogen to at least a portion of the oxide structure at a range of depths shallower than the region of concentrated nitrogen.

2. The method of claim 1, wherein said redistributing includes moving nitrogen away from the surface of the semiconductor substrate.

3. The method of claim 1, wherein said redistributing includes moving nitrogen deeper into the oxide structure.

4. The method of claim 1, wherein the structure comprising nitrogen includes silicon dioxide and silicon nitride.

5. The method of claim 1, wherein the oxide structure comprises a tunnel oxide.

6. The method of claim 1, wherein said forming the structure includes thermally annealing the surface of the semiconductor substrate.

7. The method of claim 1, wherein said forming the structure includes thermally annealing the surface of the semiconductor substrate in the presence of nitrous oxide (N2O).

8. The method of claim 1, wherein said forming the structure includes thermally annealing the surface of the semiconductor substrate in the presence of nitric oxide (NO).

9. The method of claim 1, wherein said forming the structure includes thermally annealing the surface of the semiconductor substrate in the presence of ammonia (NH3).

10. The method of claim 1, wherein said forming the structure includes thermally annealing the surface of the semiconductor substrate in the presence of ND3.

11. The method of claim 1, wherein said forming the structure includes depositing the structure on the semiconductor substrate via chemical vapor deposition.

12. The method of claim 1, wherein said forming the structure includes depositing the structure on the semiconductor substrate via plasma nitridation.

13. The method of claim 1, wherein said adding includes thermally annealing the oxide structure.

14. The method of claim 1, wherein said adding includes thermally annealing the oxide structure in the presence of nitrous oxide (N2O).

15. The method of claim 1, wherein said adding includes thermally annealing the oxide structure in the presence of nitric oxide (NO).

16. The method of claim 1, wherein said adding includes thermally annealing the oxide structure in the presence of ammonia (NH3).

17. The method of claim 1, wherein said oxidizing and said redistributing are performed by at least radical oxidation of the structure comprising nitrogen.

18. The method of claim 1, wherein said oxidizing and said redistributing are performed by at least an in situ steam generation process of the structure comprising nitrogen.

19. The method of claim 1, wherein said oxidizing and said redistributing are performed by at least low pressure radical oxidation of the structure comprising nitrogen.

20. The method of claim 1, wherein said oxidizing and said redistributing are performed by at least oxidation of the structure comprising nitrogen in the presence of oxygen radicals.

21. The method of claim 1, wherein said oxidizing and said redistributing are performed by at least oxidation of the structure comprising nitrogen in the presence of hydroxyl radicals.

22. The method of claim 1, wherein the region of concentrated nitrogen resists movement of added nitrogen to depths deeper than the region of concentrated nitrogen.

23. A method for manufacturing a semiconductor, comprising:
    forming a structure comprising nitrogen on a surface of a semiconductor substrate,
        wherein said forming includes thermally annealing the surface of the semiconductor substrate in the presence of ND3;
    performing radical oxidization of the structure to provide a nitrogen containing oxide structure; and
    adding nitrogen to at least a portion of the oxide structure.

24. The method of claim 23, wherein the oxide structure comprises a tunnel oxide.

25. The method of claim 23, wherein said forming includes thermally annealing the surface of the semiconductor substrate.

26. The method of claim 23, wherein said forming includes thermally annealing the surface of the semiconductor substrate in the presence of nitrous oxide (N2O).

27. The method of claim 23, wherein said forming includes thermally annealing the surface of the semiconductor substrate in the presence of nitric oxide (NO).

28. The method of claim 23, wherein said forming includes thermally annealing the surface of the semiconductor substrate in the presence of ammonia (NH3).

29. The method of claim 23, wherein said forming includes depositing the structure on the semiconductor substrate via chemical vapor deposition.

30. The method of claim 23, wherein said forming includes depositing the structure on the semiconductor substrate via plasma nitridation.

31. The method of claim 23, wherein said adding includes thermally annealing the oxide structure.

32. The method of claim 23, wherein said adding includes thermally annealing the oxide structure in the presence of nitrous oxide (N2O).

33. The method of claim 23, wherein said adding includes thermally annealing the oxide structure in the presence of nitric oxide (NO).

34. The method of claim 23, wherein said adding includes thermally annealing the oxide structure in the presence of ammonia (NH3).

35. The method of claim 23, wherein said performing includes oxidizing the structure and redistributing nitrogen of the structure to form a region of concentrated nitrogen in the structure.

36. The method of claim 23, wherein said performing includes oxidizing the structure and redistributing nitrogen of the structure to form a region of concentrated nitrogen in the structure and move nitrogen deeper into the structure.

37. The method of claim 23, wherein said performing includes oxidizing the structure and redistributing nitrogen of the structure to form a region of concentrated nitrogen in the structure, and the region of concentrated nitrogen resists movement of added nitrogen to depths deeper than the region of concentrated nitrogen.

38. The method of claim 23, wherein said performing includes an in situ steam generation process.

39. The method of claim 23, wherein said performing includes low pressure radical oxidation.

40. The method of claim 23, wherein said performing includes oxidation of the structure in the presence of oxygen radicals.

41. The method of claim 23, wherein said performing includes oxidation of the structure in the presence of hydroxyl radicals.

* * * * *